US009741880B2

(12) United States Patent
Fogel et al.

(10) Patent No.: US 9,741,880 B2
(45) Date of Patent: Aug. 22, 2017

(54) THREE-DIMENSIONAL CONDUCTIVE ELECTRODE FOR SOLAR CELL

(71) Applicant: INTERNATIONAL BUSINESS MACHINES CORPORATION, Armonk, NY (US)

(72) Inventors: Keith E. Fogel, Hopewell Junction, NY (US); Augustin J. Hong, White Plains, NY (US); Jeehwan Kim, Los Angeles, CA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/710,149

(22) Filed: May 12, 2015

(65) Prior Publication Data
US 2015/0255641 A1    Sep. 10, 2015

Related U.S. Application Data

(62) Division of application No. 13/173,097, filed on Jun. 30, 2011.

(51) Int. Cl.
*H01L 31/0236* (2006.01)
*H01L 31/0376* (2006.01)
(Continued)

(52) U.S. Cl.
CPC .. *H01L 31/02366* (2013.01); *H01L 31/02363* (2013.01); *H01L 31/022483* (2013.01);
(Continued)

(58) Field of Classification Search
CPC .................................................. H01L 31/1888
See application file for complete search history.

(56) References Cited

U.S. PATENT DOCUMENTS

2008/0185036 A1\* 8/2008 Sasaki ............... H01L 31/02168
136/252
2009/0194160 A1\* 8/2009 Chin ....................... H01G 9/20
136/256
(Continued)

OTHER PUBLICATIONS

Wang, H., et al. "Three-Dimensional Electrodes for Dye-Sensitized Solar Cells: Synthesis of Indium-Tin-Oxide Nanowire Arrays and ITO/TIO2 Core-Shell Nanowire Arrays by Electrophoretic Deposition" Nanotechnology, vol. 20, No. 5. Jan. 2009. pp. 1-9.

*Primary Examiner* — Jennifer Michener
*Assistant Examiner* — Christopher Danicic
(74) *Attorney, Agent, or Firm* — Tutunjian & Bitetto, P.C.; Louis J. Percello

(57) ABSTRACT

A photovoltaic device and method include forming a plurality of pillar structures in a substrate, forming a first electrode layer on the pillar structures and forming a continuous photovoltaic stack including an N-type layer, a P-type layer and an intrinsic layer on the first electrode. A second electrode layer is deposited over the photovoltaic stack such that gaps or fissures occur in the second electrode layer between the pillar structures. The second electrode layer is wet etched to open up the gaps or fissures and reduce the second electrode layer to form a three-dimensional electrode of substantially uniform thickness over the photovoltaic stack.

14 Claims, 8 Drawing Sheets

(51) Int. Cl.
*H01L 31/077* (2012.01)
*H01L 31/18* (2006.01)
*H01L 31/0352* (2006.01)
*H01L 31/0224* (2006.01)
*H01L 31/075* (2012.01)

(52) U.S. Cl.
CPC .. *H01L 31/03529* (2013.01); *H01L 31/03762* (2013.01); *H01L 31/035281* (2013.01); *H01L 31/075* (2013.01); *H01L 31/077* (2013.01); *H01L 31/1804* (2013.01); *H01L 31/1888* (2013.01); *Y02E 10/50* (2013.01)

(56) References Cited

U.S. PATENT DOCUMENTS

2010/0001359 A1* 1/2010 Jung ............... H01L 31/022466
257/458
2012/0006390 A1* 1/2012 Huo ................... H01L 21/0237
136/255

* cited by examiner

THREE-DIMENSIONAL CONDUCTIVE ELECTRODE FOR SOLAR CELL

RELATED APPLICATION DATA

This application is a divisional application of U.S. patent application Ser. No. 13/173,097 filed on Jun. 30, 2011, incorporated herein by reference in their entirety.

BACKGROUND

Technical Field

The present invention relates to photovoltaic devices, and more particularly to a device and method for fabricating a photovoltaic device structure with a textured electrode.

Description of the Related Art

With growing concern about low cost clean energy, solar power has again become a focal point for alternatives to fossil fuel energy production. Solar energy, while clean and sustainable, typically relies on expensive technologies for its implementation. These technologies include the incorporation of integrated circuits or integrated circuit technology into the fabrication of solar cells. The expense associated with current solar panels is a strong disincentive from moving in the direction of solar power.

Solar panels employ photovoltaic cells to generate current flow. When a photon hits silicon, the photon may be transmitted through the silicon, reflected off the surface, or absorbed by the silicon if the photon energy is higher than the silicon band gap value. This generates an electron-hole pair and sometimes heat, depending on the band structure. The greater the absorption the greater the efficiency of the cell.

Textured structures have been employed to increase the absorption efficiency. However, challenges arise at several points in the process. One such problem includes the formation of a bottom electrode. A bottom electrode deposition occurs by forming a thick layer of electrode material and deep reactive ion etching (DRIE) the material to attempt to conform the bottom electrode material to the shape of the underlying structure. DRIE is a highly anisotropic etch process making the formation of the bottom electrode highly sensitive to thickness variations. A bottom electrode that is too thin results in series resistance problems and affects the efficiency of the solar cell.

SUMMARY

A photovoltaic device and method include forming a plurality of pillar structures in a substrate, forming a first electrode layer on the pillar structures and forming a continuous three-dimensional (3D) photovoltaic stack including an N-type layer, a P-type layer and an intrinsic layer on the first electrode. A second electrode layer is deposited over the photovoltaic stack such that gaps or fissures occur in the second electrode layer between the pillar structures. The second electrode layer is wet etched to open up the gaps or fissures and reduce the second electrode layer to form a three-dimensional electrode of substantially uniform thickness over the 3D photovoltaic stack.

A method for forming a photovoltaic device includes forming a plurality of pillar structures in a substrate; forming a first electrode layer on the pillar structures; forming a continuous photovoltaic stack including an N-type layer, a P-type layer and an intrinsic layer on the first electrode; depositing a second electrode layer over the photovoltaic stack such that gaps or fissures occur in the second electrode layer between the pillar structures; further depositing the second electrode layer to enclose the fissures in the second electrode layer; and wet etching the second electrode layer reduce the second electrode layer and form a three-dimensional electrode over the photovoltaic stack.

A photovoltaic device includes a substrate layer having a plurality of pillar structures formed therein, and a first electrode formed over the substrate layer and extending over the pillar structures. A continuous photovoltaic stack is conformally formed over the first electrode, and a second electrode is formed on the photovoltaic stack and includes gaps between the pillar structures buried within the second electrode.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
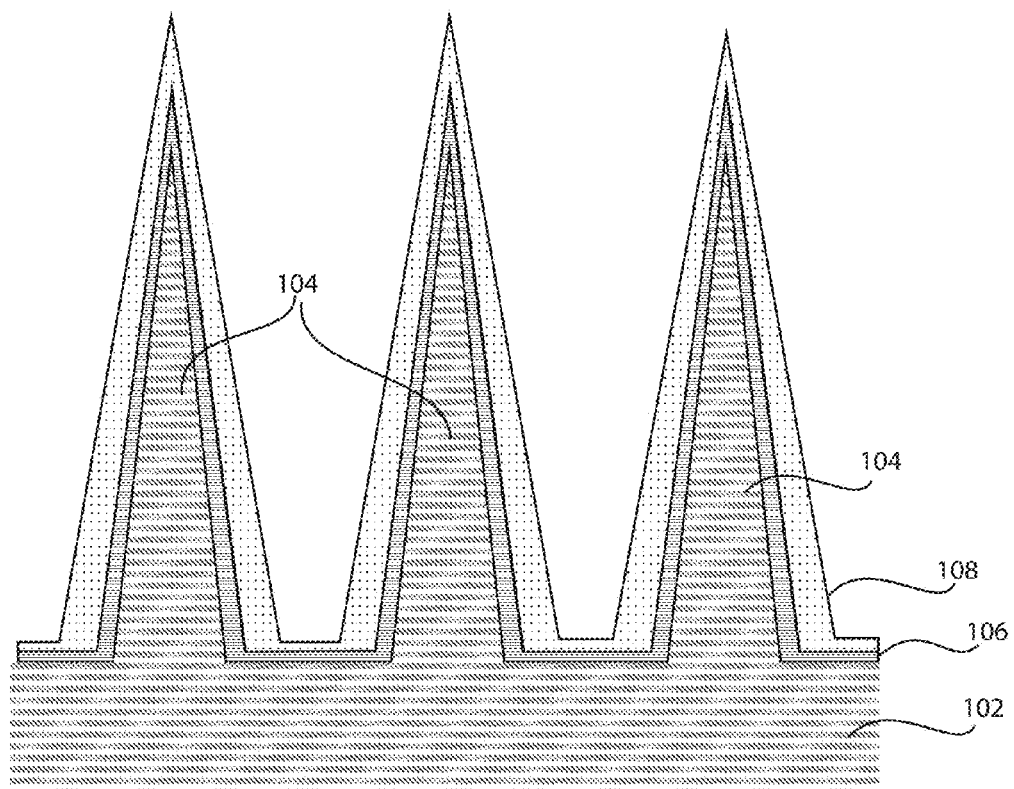
FIG. 1 is a cross-sectional view of a photovoltaic device having a plurality of pillar structures with a first electrode and a photovoltaic stack formed thereon in accordance with one embodiment.

In accordance with the present principles, devices and methods for fabricating photovoltaic devices are provided. The devices employ a substrate layer having prefabricated structures configured to provide a vertical component of a radiation absorption layer. The vertical component may include a hill and trough structure having sides that carry the light absorbing material. The sides provide a depth to increase the likelihood of absorption of the radiation. In this way, the structures provide an inexpensive method that does not require expensive lithographic patterning and results in higher absorption efficiency.

In one embodiment, after forming the active radiation absorbing layers, a bottom electrode is formed by depositing a thick layer of bottom electrode material followed by a wet etch. The wet etch takes advantage of the geometric gaps and crevices in the thick layer due to the underlying textured structures to provide a more uniform and contoured bottom electrode. In another embodiment, the bottom electrode material is formed so thick that the crevices and gaps are buried.

It is to be understood that the present invention will be described in terms of given illustrative architectures for a solar cell; however, other architectures, structures, substrate materials and process features and steps may be varied within the scope of the present invention. A circuit formed using these structures as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips and/or solar cells. The resulting integrated circuit chips or cells can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes photovoltaic devices, integrated circuit chips with solar cells, ranging from toys, calculators, solar collectors and other low-end applications to advanced products.

It will also be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring now to the drawings in which like numerals represent the same or similar elements and initially to FIG. 1, an illustrative photovoltaic structure 100 is illustratively depicted in accordance with one embodiment. The photovoltaic structure 100 may be employed in solar cells, light sensors or other photovoltaic applications. Structure 100 includes a substrate 102. The substrate 102 includes cone shaped pillars 104. The pillars 104 may be fabricated by any number of processes, such as forming mechanical grooves, employing a nanodot or other pattern and etching the substrate, etc. The substrate 102 may include a silicon material, a glass or other etchable transparent substrate material. A silicon substrate may include a single (monocrystalline) silicon or a polycrystalline silicon (polysilicon). While other substrate materials may be employed silicon based materials including glass are preferred.

The pillars 104 assist in increasing the surface area of absorption and provide for radiation trapping between the pillars 104. The pillar structures may be constructed to receive light with the pillars 104 facing out (e.g., toward the light) or facing in. The pillars 104 increase the surface area and therefore the collection efficiency in any incident light direction as compared to a flat surface cell. The present embodiments will be described in terms of the pillars 104 facing away from the incident light in a final device structure. The pillars 104 may include a height or about one micron, although larger or smaller pillars are contemplated.

A first electrode layer 106 is formed on pillars 104 by a deposition process. The first electrode layer 132 may include a transparent conductive material such as a transparent conductive oxide (e.g., zinc oxide, indium tin oxide, indium zinc oxide, etc.), ultra-thin metal (e.g., 20 nm or less in thickness) or other conductive structure. The deposition process may include a chemical vapor deposition (CVD) process or other suitable deposition process. A p-i-n diode stack 108 is formed over the first electrode 106. The stack 108 preferably includes a first doped layer (p-doped layer), and intrinsic layer (i-layer) and a second doped layer (n-doped layer). The stack 108 may be formed using a plasma enhanced chemical vapor deposition (PECVD) process. The stack 108 provides active areas for absorbing radiation and converting the radiation into charge flow as is known in the art. A plurality of different materials may be selected for the layers in stack 108. In one particularly useful embodiment, the first and second doped layers may include doped polycrystalline/microcrystalline silicon and the intrinsic layer may include undoped amorphous silicon. It should be understood that other layers and features may be included, such as contact layers, etc., or even multiple photovoltaic stacks may be employed.

Figure 2:
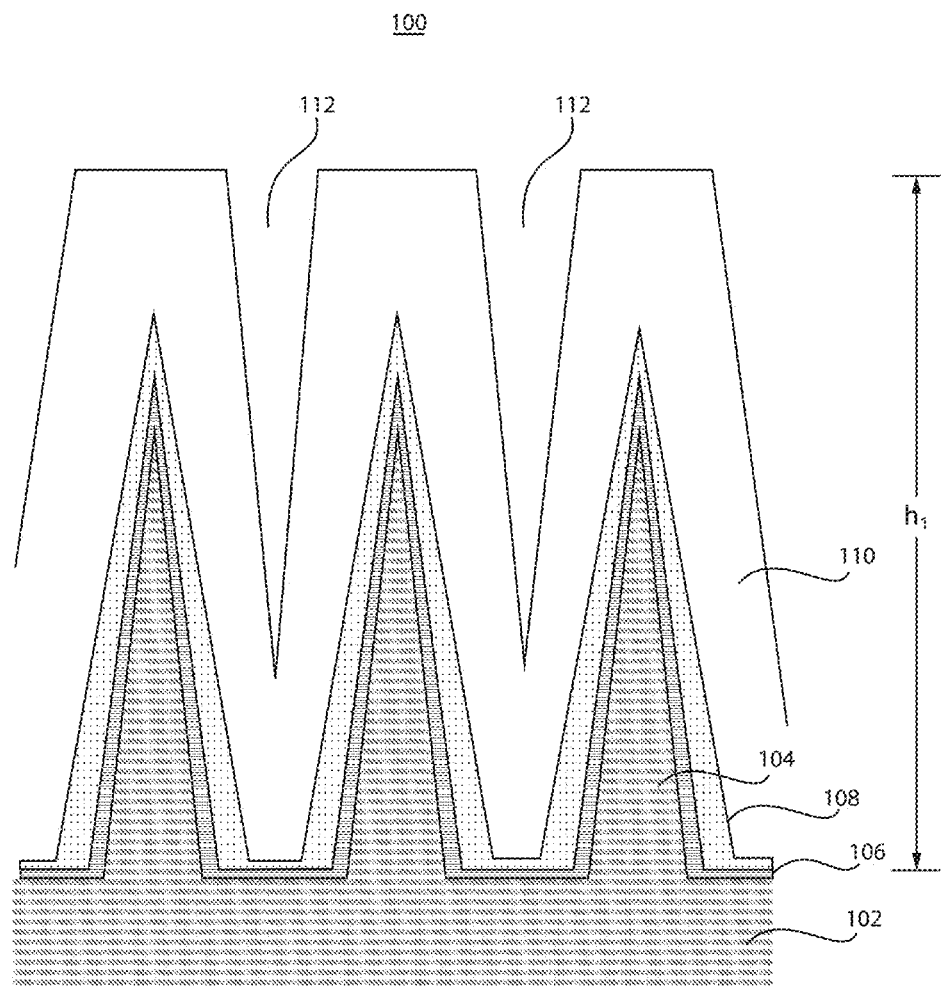
FIG. 2 is a cross-sectional view of the photovoltaic device of FIG. 1 having a second electrode formed with gaps and fissures in accordance with one embodiment.

Referring to FIG. 2, a second electrode 110 is formed on the stack 108. The second electrode 110 may include a transparent conductive material such as a transparent conductive oxide (e.g., zinc oxide, doped zinc oxide, tin oxide, a fluorine-doped tin oxide, indium tin oxide, indium zinc oxide, etc.), metal or other conductive structure. The deposition process may include a sputtering process, other physical vapor deposition process or other suitable deposition process. In this embodiment, second electrode 110 forms a bottom electrode for the device 100.

In one embodiment, the bottom electrode 110 includes ZnO and is formed as deposited to a height, $h_1$ of about 2 microns with the pillars 104 being about 1 micron in width. The final etched thickness of the electrode 110 on the pillars 104 is between about 100 nm and 500 nm. In this embodiment, gaps/fissures/grain boundaries 112 form between pillars 104, and will be employed to form a final configuration of the bottom electrode 110 (FIG. 3A).

Figure 3A:
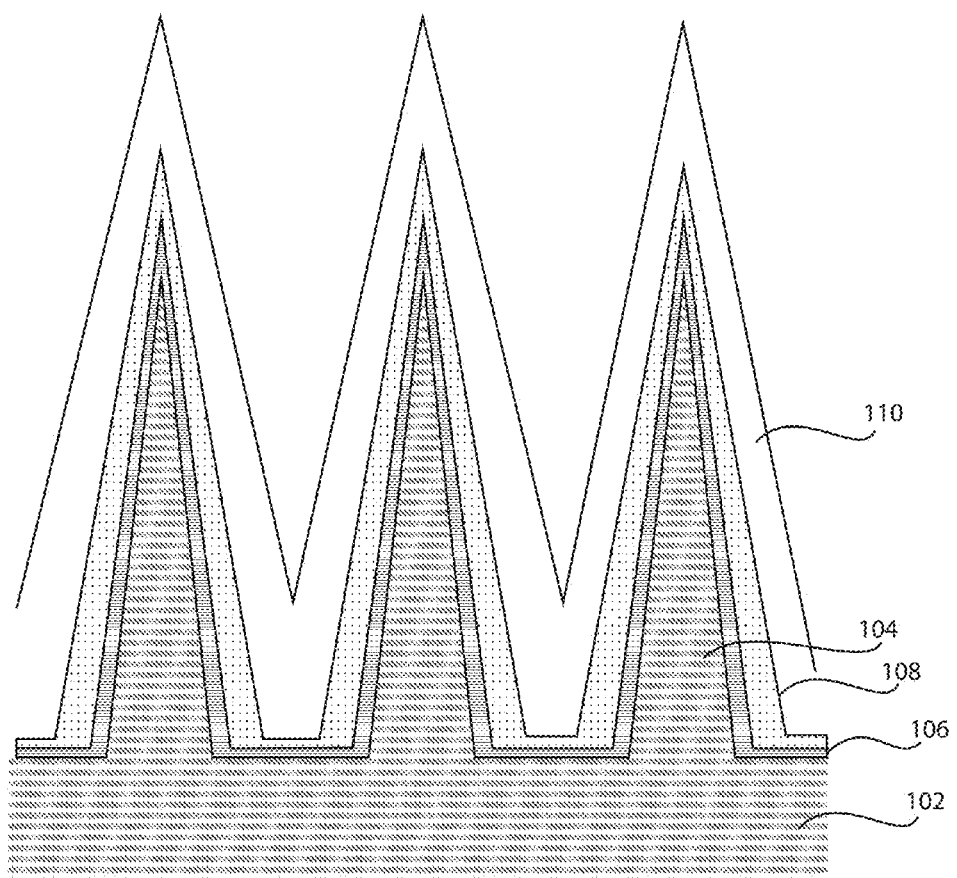
FIG. 3A is a cross-sectional view of the photovoltaic device of FIG. 2 having the second electrode wet etched in accordance with one embodiment.

Referring to FIG. 3A, a wet etch process is employed to reduce the size of the, as deposited, bottom electrode 110 and to exploit the gaps/fissures 112. The wet etching process results in a simultaneous reduction and narrowing of the shape of the bottom electrode 110 to provide a more conforming profile. The wet etching process may include a hydrochloric acid (HCl) although other etchants may be employed, e.g., HF, $HNO_3$, etc. In addition, the wet etching process provides better process control for the bottom electrode 110 thickness and is much more inexpensive than deep reactive ion etching. The bottom electrode 110 in this embodiment, forms a three-dimensional electrode and includes a textured surface conforming with the between pillars 104.

Additional layers may be formed before or on the bottom electrode 110. These layers may include reflective materials. A back reflector layer may be formed with a reflective surface to reflect transmitted light back toward the light absorption layer. The surface preferably may include a highly reflective material, such as silver (Ag), chromium (Cr), etc.

Figure 3B:
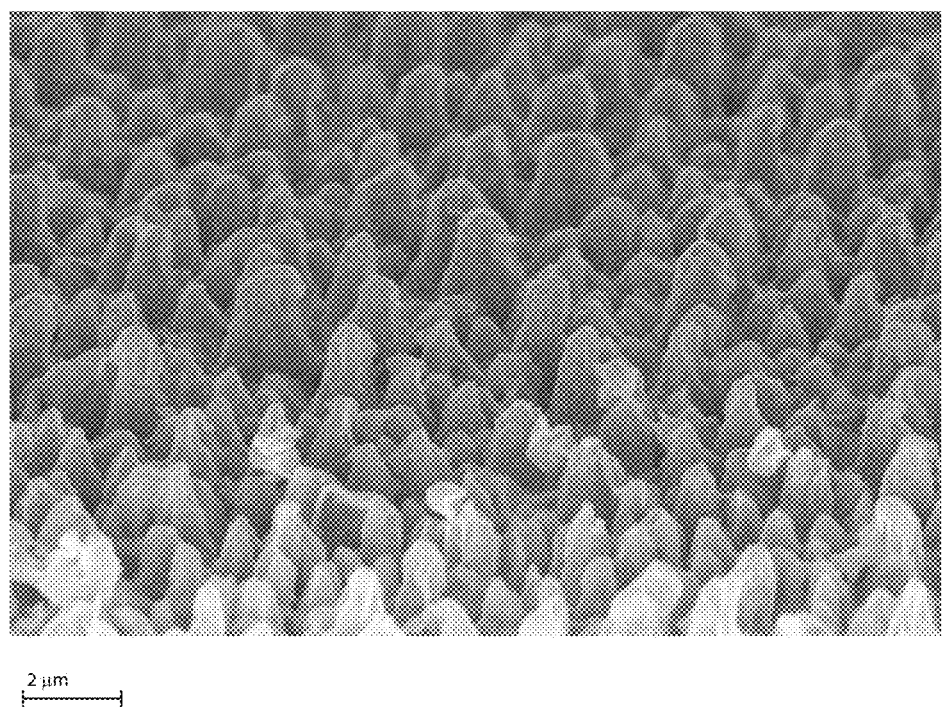
FIG. 3B is a scanning electron microscope image of the device after wet etching in FIG. 3A.

Referring to FIG. 3B, a scanning electron microscope (SEM) image shows the results of the wet etch of FIG. 3A. The image of FIG. 3B is the result of a 1:200 $HCl:H_2O$ wet etch for 20 seconds. Other wet etch solutions and etch times may also be employed.

Figure 4:
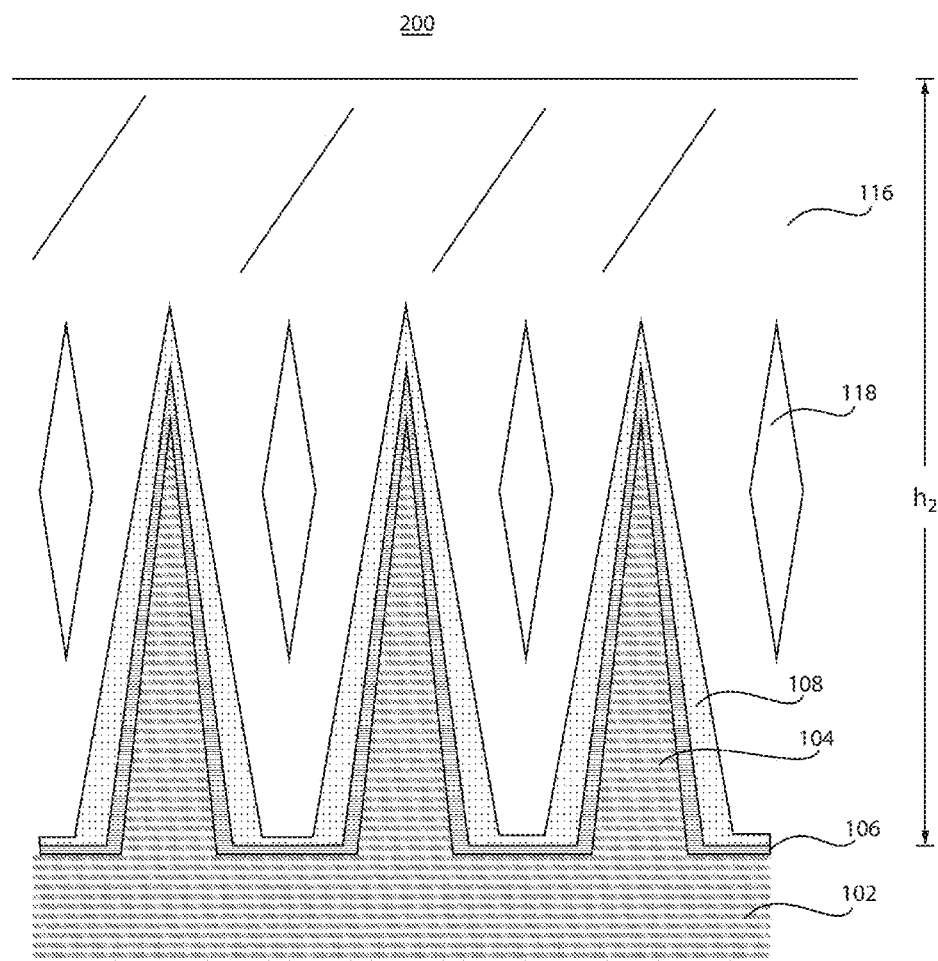
FIG. 4 is a cross-sectional view of the photovoltaic device of FIG. 1 having a second electrode formed with gaps and fissures enclosed by the second electrode layer in accordance with another embodiment.

Referring to FIG. 4, a photovoltaic device 200 in accordance with another embodiment is illustratively shown. Beginning with the structure depicted in FIG. 1, a bottom electrode layer 116 is deposited over the stack 108 on pillars 104. The deposition may be performed by sputtering or other deposition process. The bottom electrode layer 116 includes a sufficient thickness to enclose gaps/fissures 118. The bottom electrode layer 116 may include a transparent conductive oxide (TCO), such as, a tin oxide, a fluorine-doped tin oxide ($SnO_2$:F, or "FTO"), a zinc oxide, a doped zinc oxide (e.g., ZnO:Al), indium tin oxide (ITO) or other suitable materials. The bottom electrode layer 116 may include an as deposited height $h_2$ of between about 3 microns to about 5 microns. The final thickness of the bottom electrode layer 116 in this embodiment is about 3-4 microns.

Figure 5A:
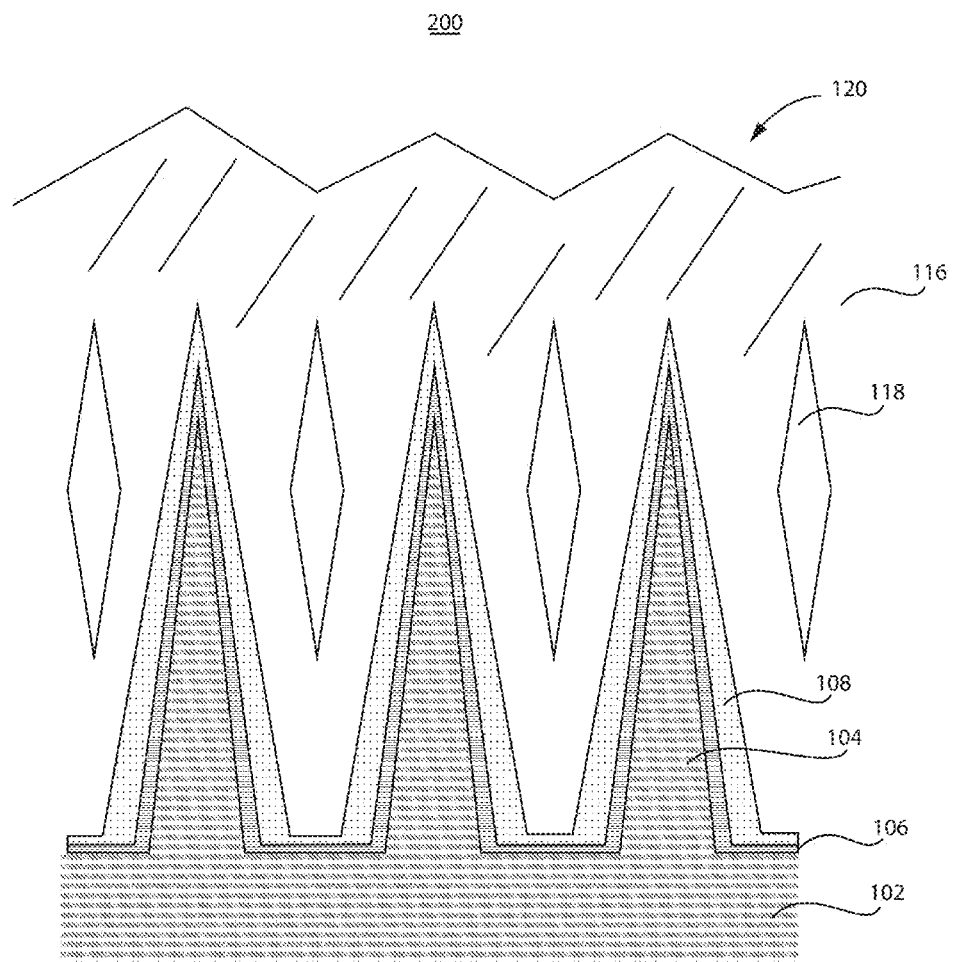
FIG. 5A is a cross-sectional view of the photovoltaic device of FIG. 4 having the second electrode wet etched in accordance with one embodiment.

Referring to FIG. 5A, the photovoltaic structure 200 may be subjected to a wet etch process as described above to reduce the bottom electrode layer 116 to a desired thickness and to further provide a contoured or textured surface 120 which may be employed to redirect incident radiation toward light absorption layers in the stack 108. The bottom electrode layer 116 in this embodiment forms a three-dimensional electrode and includes a textured surface 120 and buried gaps/fissures 118 between pillars 104.

Figure 5B:
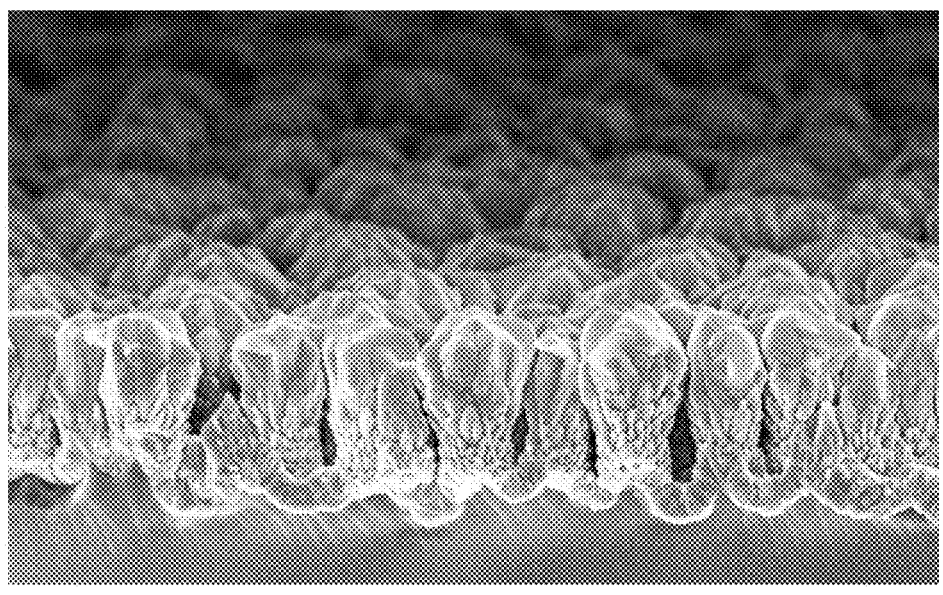
FIG. 5B is a scanning electron microscope image of the device after wet etching in FIG. 5A.

Referring to FIG. 5B, a scanning electron microscope (SEM) image shows the results of the wet etch of FIG. 5A. The image of FIG. 5B is the result of an HF etch for 20 minutes. Other wet etch solutions and etch times may also be employed.

Figure 6:
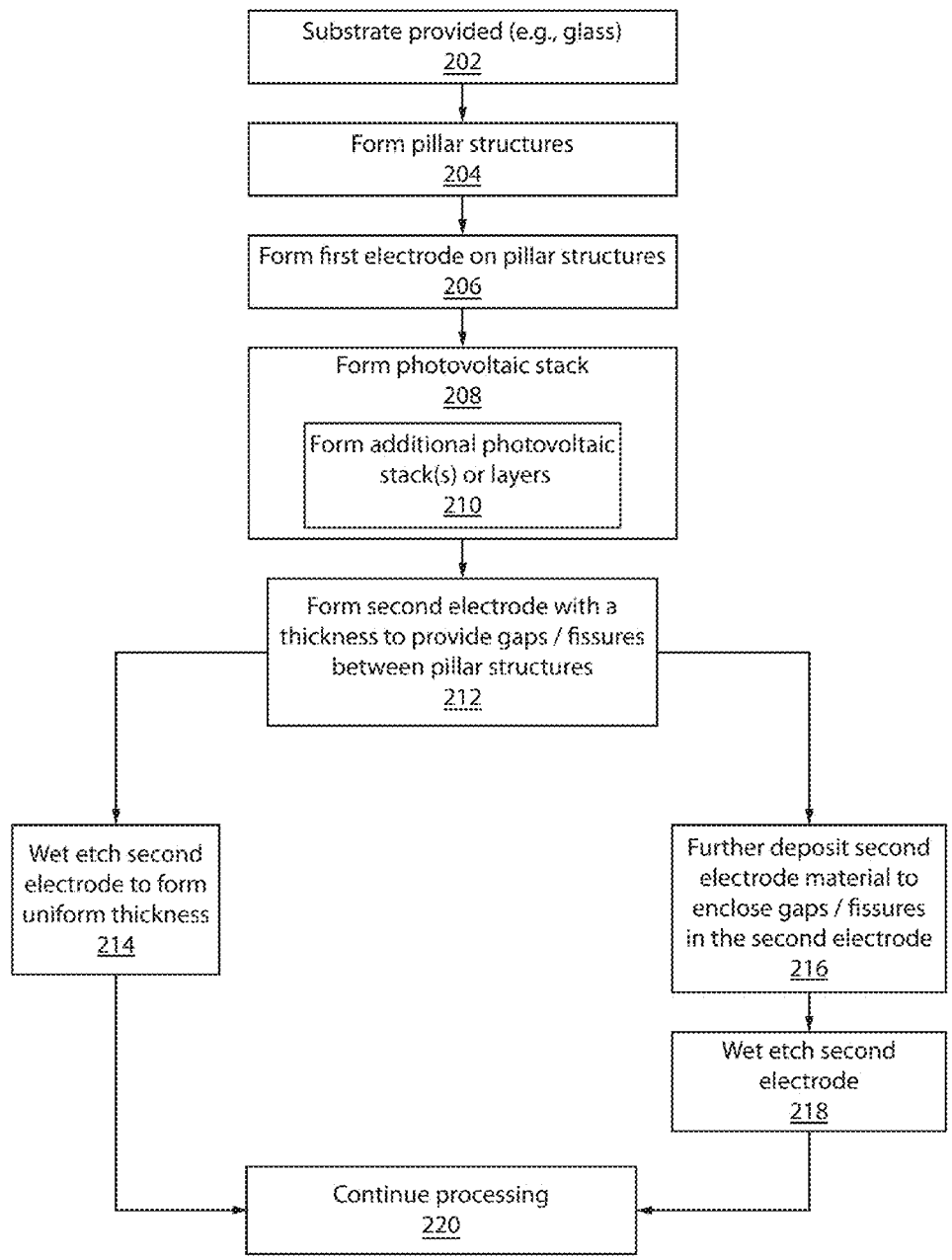
FIG. 6 is a flow diagram showing methods for fabricating a photovoltaic device in accordance with the present principles.

Referring to FIG. 6, methods for forming a photovoltaic device in accordance with illustrative embodiments are illustratively shown. The flowchart/block diagram in the FIG. 6 illustrates the architecture, functionality, and operation of possible implementations of methods according to various embodiments of the present invention. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

In block 202, a substrate layer is provided. In attempting to reduce cost, the present principles prefer the use of a non-semiconductor substrate layer material. For example, the substrate may include glass. In block 204, a plurality of pillar structures are formed in the substrate. This may include mechanically forming a plurality of grooves, chemically etching the pillar structures, etc. The pillar structures preferably include a depth of less than about two microns, more preferably one micron. Larger dimensions may be employed; however, the active layers are preferably nanoscale and a depth of about a micron is preferable. Other methods include using 3D structuring such as embossing, stamping, molding, etc. for forming pillars.

In block 206, a first electrode layer is formed on the pillar structures. The first electrode layer may include a transparent conductive oxide, an ultrathin metal or other transparent conductive material. The first electrode may be a few nanometers thick, e.g., 5 nm-20 nm for ultrathin metal or conductive materials that are non-transparent and 200 nm-300 nm for transparent conductive oxide. In block 208, a continuous photovoltaic stack is formed on the first electrode. The stack may include an N-type layer, a P-type layer and an intrinsic layer disposed between the N and P-type layers. Additional photovoltaic stacks and other layers may also be formed on the continuous photovoltaic stack in block 210.

In one embodiment, in block 212, a second electrode layer is formed over the photovoltaic stack(s) and includes a thickness such that gaps or fissures occur in the second electrode layer between the pillar structures. The thickness of the second electrode layer may be greater than one micron, and more preferably about 2 microns, although thicker layers may be employed. The second electrode layer preferably includes a transparent conductive oxide, such as e.g., ZnO, and the transparent conductive oxide may be applied by sputtering.

In block 214, the second electrode layer is wet etched to open up the gaps or fissures and reduce the second electrode layer to form a three-dimensional electrode of substantially uniform thickness over the photovoltaic stack. The wet etching may include employing hydrochloric acid or the like.

In another embodiment, in block 216, the second electrode layer is further deposited to enclose the fissures in the second electrode layer. The depositing includes a thickness of between about 3 microns to about 5 microns. In block 218, the second electrode layer is wet etched to reduce the second electrode layer and form a three-dimensional electrode over the photovoltaic stack. The wet etching may include employing hydrochloric acid or the like. In block 220, additional processing may be performed including forming additional layers or features.

Having described preferred embodiments for a three-dimensional conductive electrode for a solar cell (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a photovoltaic device, comprising: forming a plurality of pillar structures in a substrate; forming a first electrode layer on the pillar structures;
  forming a continuous photovoltaic stack including an N-type layer, a P-type layer and an intrinsic layer on the first electrode layer;
  depositing a second electrode layer over the photovoltaic stack such that air gaps occur in the second electrode layer between the pillar structures, wherein the air gaps extend in a stack direction for a majority of the height of the pillar structures and wherein only a single air gap is formed between each set of adjacent pillar structures;

further depositing the second electrode layer to enclose the air gaps in the second electrode layer, wherein the enclosed air gaps extend in a stack direction for a majority of the height of the pillar structures; and wet etching the second electrode layer to reduce the second electrode layer and to form a three-dimensional electrode over the photovoltaic stack.

2. The method as recited in claim 1, wherein the second electrode layer includes a transparent conductive oxide and the step of depositing includes depositing the second electrode layer by sputtering.

3. The method as recited in claim 2, wherein the transparent conductive oxide includes ZnO.

4. The method as recited in claim 1, wherein the substrate includes glass.

5. The method as recited in claim 1, wherein wet etching includes employing hydrochloric acid.

6. The method as recited in claim 1, wherein depositing includes depositing the second electrode layer to a thickness of between about 3 microns to about 5 microns.

7. A photovoltaic device, comprising:
a substrate layer having a plurality of pillar structures formed therein;
a first electrode formed over the substrate layer and extending over the pillar structures;
a continuous photovoltaic stack conformally formed over the first electrode; and
a second electrode formed on the photovoltaic stack and including air gaps between the pillar structures buried within the second electrode, wherein only a single air gap is enclosed within the second electrode layer between sets of adjacent pillar structures so that the single air gap between each set of adjacent pillar structures extends in a stack direction for a majority of the height of the pillar structures.

8. The device as recited in claim 7, wherein the photovoltaic stack includes a P-type layer, an N-type layer and an intrinsic layer disposed therebetween.

9. The device as recited in claim 7, wherein the substrate includes glass.

10. The device as recited in claim 7, further comprising at least one additional continuous photovoltaic stack formed on the continuous photovoltaic stack.

11. The device as recited in claim 7, wherein the second electrode includes a thickness of between about 3 and 5 microns.

12. The device as recited in claim 7, wherein the second electrode includes a three-dimensional texture surface that is opposite a surface of the second electrode in contact with the pillar structures.

13. The device as recited in claim 7, wherein the second electrode layer includes a transparent conductive oxide.

14. The device as recited in claim 13, wherein the transparent conductive oxide includes ZnO.

* * * * *